United States Patent
Groeseneken et al.

(10) Patent No.: US 6,570,226 B1
(45) Date of Patent: May 27, 2003

(54) DEVICE AND CIRCUIT FOR ELECTROSTATIC DISCHARGE AND OVERVOLTAGE PROTECTION APPLICATIONS

(75) Inventors: Guido Groeseneken, Leuven (BE); Christian Russ, Princeton, NJ (US)

(73) Assignees: Interuniversitair Microelektronia Centrum (IMEC), Leuven (BE); STMicroelectronics NV, Amsterdam (NL)

( * ) Notice: Subject to any disclaimer, the term of this patent is extended or adjusted under 35 U.S.C. 154(b) by 0 days.

(21) Appl. No.: 09/586,699

(22) Filed: Jun. 1, 2000

(30) Foreign Application Priority Data

Jun. 1, 1999 (EP) .............................. 99870110

(51) Int. Cl.$^7$ ................................. H01L 23/62
(52) U.S. Cl. .................. 257/361; 257/360; 257/362
(58) Field of Search ................ 257/360, 361, 257/362

(56) References Cited

U.S. PATENT DOCUMENTS

| | | | |
|---|---|---|---|
| 4,760,433 A | * 7/1988 | Young et al. | |
| 5,602,404 A | 2/1997 | Chen et al. | 257/112 |
| 5,654,571 A | * 8/1997 | Tsuji | 257/357 |
| 5,696,397 A | * 12/1997 | Sakai | 257/355 |
| 5,747,837 A | 5/1998 | Iwase et al. | 257/173 |
| 5,821,572 A | 10/1998 | Walker et al. | 257/107 |
| 5,898,205 A | * 4/1999 | Lee | 257/355 |
| 6,078,083 A | * 6/2000 | Amerasekera et al. | 257/358 |

FOREIGN PATENT DOCUMENTS

| | | |
|---|---|---|
| EP | 0 753 892 | 1/1997 |
| WO | WO 96/21247 | 7/1996 |

* cited by examiner

Primary Examiner—Ngăn V. Ngô
(74) Attorney, Agent, or Firm—McDonnell Boehnen Hulbert & Berghoff (57) ABSTRACT

The present invention is related to a semiconductor device for electrostatic discharge or overvoltage protection applications, said device comprising means for absorbing an electrostatic discharge pulse or an overvoltage level, said means being triggered at intermediate voltages and said means including a series configuration of at least two trigger components. Said means can further be extended with a third trigger component and possibly further trigger components in said series configuration, the addition of said third and further trigger components extending sequentially the range of the intermediate trigger voltages. Said trigger components can comprise components, preferably diodes, with a specific breakdown voltage, the sum of the breakdown voltages of said diodes defining the specific intermediate trigger voltage of said device.

39 Claims, 8 Drawing Sheets

Fig. 11

DEVICE AND CIRCUIT FOR ELECTROSTATIC DISCHARGE AND OVERVOLTAGE PROTECTION APPLICATIONS

REFERENCE TO RELATED APPLICATIONS

This application claims priority benefits to European Patent Application Number 99870110.6 filed on Jun. 1, 1999.

FIELD OF THE INVENTION

The present invention is related to a semiconductor device and a circuit for electrostatic discharge and overvoltage protection applications.

BACKGROUND OF THE INVENTION

Electronic devices and circuits are to be protected against damage arising from electrostatic discharge pulses, current transients or overvoltage levels. Protection devices or circuits using silicon controlled rectifier structures (SCR) are known in the art. SCR devices were applied frequently as an efficient electrostatic discharge protection clamp. These devices are made such that as a result of electrostatic discharge (ESD) pulses, current transients or overvoltage levels, an n-p-n-p thyristor structure is triggered thereby ensuring the clamping of the ESD-pulses, and snapback of the device to very low holding voltages. These devices furthermore are such that this absorption of electrostatic discharge pulses, current transients or overvoltage levels leads to low power dissipation after triggering. Examples of such SCR devices are disclosed in the U.S. Pat. Nos. 5,072,273, 5,343,053 and 5,663,860.

Figures 1, 2:
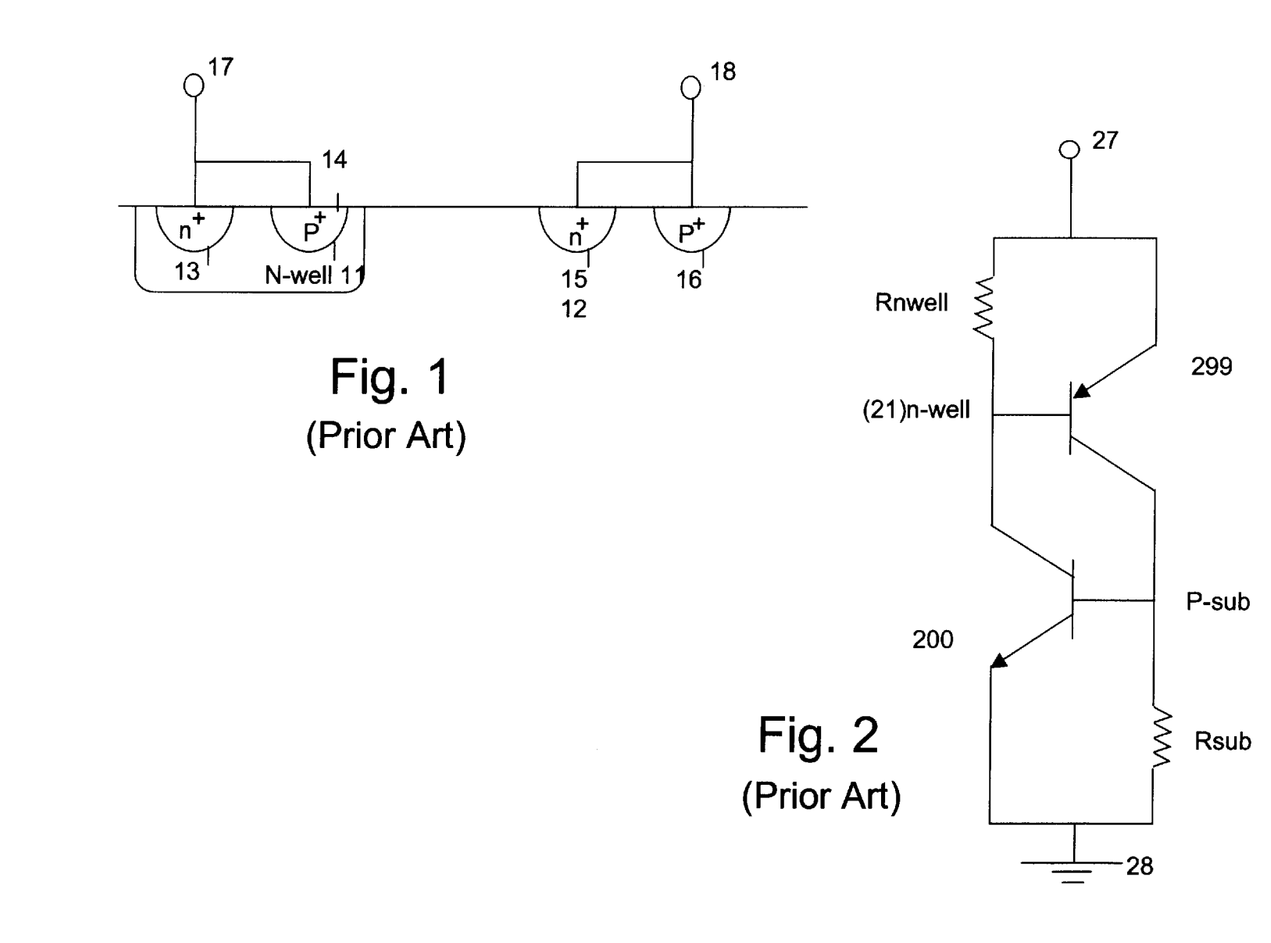
FIG. 1 shows the cross section of a prior art SCR-device.
FIG. 2 shows an equivalent circuit representation of the SCR-device shown in FIG. 1.

A cross-section of a prior art classical SCR-device is shown on FIG. 1. The SCR-device is fabricated in a semiconductor substrate 12 of a p-type conductivity with a n-well 11 therein. In the figure, the pad connection 17 is connected to both the n-well contact region 13 and a p+-region 14 inside the n-well. The ground is connected to the p-substrate contact region 16 and an n+-region 15 inside the p-substrate 12. An equivalent circuit schematic is shown in FIG. 2. It comprises a parasitic pnp 299 and a parasitic npn transistor 200 that are connected. The npn-transistor 200 consists of the n-well/p-substrate/n+region, whereas the pnp-transistor 299 consists of the p+-region/n-well/p-substrate.

In normal operating conditions, the SCR-device is off. When a positive ESD-pulse is applied at the pad, the n-well 11 to p-substrate 12 diode 11/12 is reverse biased, until it goes into breakdown. This typically happens at voltages on the order of 40–50V. Once the n-well/substrate diode is in breakdown, electron-hole pairs are generated in the space-charge region of this diode. The holes are flowing to the p-substrate contact 16, whereas the electrons are flowing to the n-well contact 13. Due to the substrate resistance Rsub, the p-base of the parasitic npn transistor 200 is charging up, and when the base voltage is becoming higher than 0.7V, this npn parasitic transistor is triggered. At about the same time, the pnp transistor is triggered due to the charging up phenomenon, and via a positive feedback mechanism, the device is latched into a low impedance state, with a low holding voltage of typically 2–3 Volt, or in some applications 3–4V, and a low series resistance of typical a few Ohm, which leads to very low power dissipation and high ESD-thresholds.

Figures 3, 4:
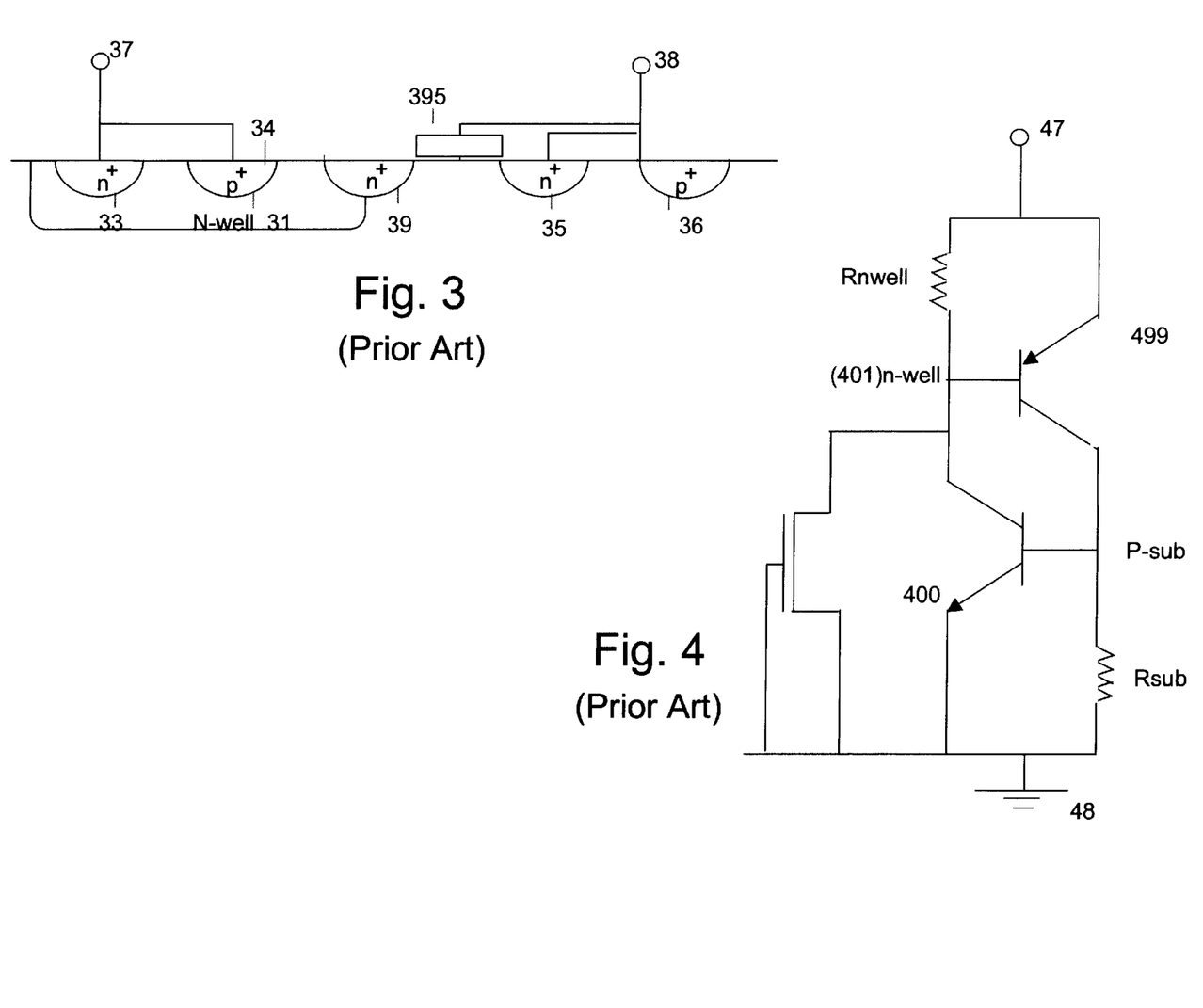
FIG. 3 shows the cross section of a prior art SCR-device with means for protection against low voltage pulses.
FIG. 4 shows an equivalent circuit representation of the SCR-device shown in FIG. 3.

The problem of most of the classical SCR devices is that the trigger voltage at which the device goes into the low-impedance on-state is quite high, typically 50V, which is too high for normal low-voltage technologies. In order to allow the use of SCR-devices but avoid the high trigger voltages, a so-called low-voltage triggered SCR (LVTSCR) has been proposed. A cross section of the LVTSCR is shown on FIG. 3, and an equivalent circuit schematic is shown on FIG. 4. In this protection device, an n+region 39 is implanted at the edge between the n-well 31 and the p-substrate 32. The n+-region/p-substrate junction will go into breakdown at a lower voltage, typical 13–14V, in this way lowering the triggering voltage of the SCR. The n+-region can be separated from the n+region in the p-substrate either by a field oxide or by a poly-gate (395, shown in FIG. 3). In the latter case, the gate of the parasitic nMOS is connected to the ground, as is shown on FIGS. 3 and 4. This device is well suited to protect technologies with normal operating voltages.

AIMS OF THE INVENTION

The classical SCR protection devices are typically suited for high voltage applications, whereas the LVTSCR structure is frequently used for normal operating voltage applications. For some applications, however, the low trigger voltage (for instance of 14V) for an LVTSCR is too low, whereas the high trigger voltage (for instance of 50V) for the classical SCR is too high. As a result, there is a need for SCR-structures that trigger at intermediate voltages, or for which the trigger voltage can be adapted, depending on the application.

The present invention aims to fill this gap in protection devices. The present invention discloses a semiconductor device for electrostatic discharge or overvoltage protection applications, said device comprising means for absorbing an electrostatic discharge pulse or an overvoltage level, said means being triggered at intermediate voltages.

The present invention furthermore discloses a semiconductor device for electrostatic discharge or overvoltage protection applications, said device comprising means for absorbing an electrostatic discharge pulse or an overvoltage level, said means being triggered at intermediate voltages and said means being extendable with a third trigger component and possibly further trigger components, the addition of said third and further trigger components extending sequentially the range of the intermediate trigger voltages such that the protection trigger voltage can be adapted depending on the application.

SUMMARY OF THE INVENTION

In a first aspect of the present invention, a semiconductor device for electrostatic discharge or overvoltage protection applications is disclosed, said device comprising means for absorbing an electrostatic discharge pulse or an overvoltage level, said means being triggered at intermediate voltages and said means including a series configuration of at least two trigger components. Said means can further be extended with a third trigger component and possibly further trigger components in said series configuration, the addition of said third and further trigger components extending sequentially the range of the intermediate trigger voltages. Said trigger components can comprise components, preferably diodes, with a specific breakdown voltage, the sum of the breakdown voltages of said diodes defining the specific intermediate trigger voltage of said device.

In another embodiment of the device of the invention according to the first aspect, the device can further comprise an integrated circuit having a functionality and an impedance being in the connection of said means to said circuit. The impedance can be replaced by any means being adapted for building up a voltage drop. The impedance preferably is a resistor. Said circuit further comprises components or has components in parallel or connected to the circuit, components that convert an overvoltage level or an electrostatic discharge pulse of an intermediate level into an electrical current, said current creating a voltage of an intermediate level over said impedance, said voltage triggering said means such that said overvoltage level or electrostatic discharge pulse is absorbed.

For the purpose of this patent application, the following terms are introduced here. A trigger component, or triggering component, has the meaning that in the devices of the invention, at least one component or the triggering component is made such that as a result of electrostatic discharge (ESD) pulses, current transients or overvoltage levels, this component is triggered thereby ensuring the clamping of the ESD-pulses, and snapback of the device to very low holding voltages. Thus, the electrostatic discharge pulses, current transients or overvoltage levels are absorbed in the device of the invention by making use of the above-introduced trigger components and further in such a way that a low power dissipation occurs in the device after triggering and snapback of the device to the low holding voltages. Low, high and intermediate voltages are to be understood in the context of a specific protection application for a specific technology. The terms low, high and intermediate voltage levels refer to overvoltage levels or to voltage levels resulting from electrostatic discharge pulses. Such voltages are higher than the normal operating voltages of electronic systems and can be classified in terms of high, intermediate and low overvoltage levels, the specific voltage values corresponding to high, low and intermediate being dependent on the specific technology. For the mainstream applications (for example a 0.7 $\mu$m CMOS technology), the normal operating voltages are of the order of 5–12 Volt. A high overvoltage level is than referred to as about 40–50 Volt. A low overvoltage level is referred to as of the order of 14 Volt. Intermediate overvoltage levels are levels therebetween. Thus, the specific values of the terms low, high and intermediate overvoltage levels depend on the specific application, specifically on the values of the normal operating voltages of the specific technology. It is known in the art that the normal operating voltages for instance a 0.25 $\mu$m CMOS technology are lower than 5–12 Volt. Thus the value of a low overvoltage level may also be lower than 14 Volt and the value of a high overvoltage level may also be lower than or equal to, or even be higher than 50 Volt.

In a second aspect of the present invention, a semiconductor device for electrostatic discharge or overvoltage protection applications is disclosed, said device comprising a first region of a first conductivity type in a semiconducting substrate of a second conductivity type and at least two separated regions of said second conductivity type being within said first region, said separated regions of said second conductivity type not abutting the substrate region of said second conductivity type. The device further comprises at least two separated regions of said first conductivity type being within said substrate, said separated regions of said first conductivity type not abutting said first region; and a connection inbetween at least one of said separated regions of said second conductivity type within said first region and at least one of said separated regions of said first conductivity type within said substrate.

The connection is such that said device is absorbing an electrostatic discharge pulse or an overvoltage level at an intermediate voltage level. In a first embodiment of this second aspect of the invention, said connection can be a low-resistive connection, preferably a metal line, and preferably external to said first region and to said substrate. In a second embodiment, said connection can comprise at least one component having a breakdown voltage, said component being in series with said separated regions of said second conductivity type and said separated regions of said first conductivity type. According to this second embodiment of the invention, said connection can comprise at least one region of said first and/or at least one region of said second conductivity type, said regions being within a second region of either one of said conductivity types, the second region being of the other (second or first) conductivity type than the embedded region (of a first or second conductivity type resp.). One of these regions in the second region can be present as a contact region. Additional regions can be embedded within said second region. Preferably, this second region is within said substrate and is of said first conductivity type. At least part of the regions that are embedded within said second region are connected to the separated regions in the first region and in the substrate. Specifically, one region of said first conductivity (one region of these embedded regions in the second region) can be directly connected with a low-resistive connection to one of the separated regions of said second conductivity type in the first region. Furthermore, one region of said second conductivity type of these embedded regions can be directly connected with a low-resistive connection to one of the separated regions of said first conductivity type in said substrate.

In the device of the invention, the regions of at least one of the set of said separated regions can be separated by an insulating material, said material preferably comprising an oxide material. The separated regions can also be separated by a control terminal overlying said substrate or said first region with an insulating material therebetween. One region of at least one of the set of said separated regions can be directly connected to the control terminal of said one set.

In the device of the invention according to the second aspect of the invention, said first region of said first conductivity type can be connected to a pad contact and said substrate of said second conductivity type is connected to ground, the connections to said pad contact and to ground preferably being via a highly doped contact region in said first region and said substrate respectively. It is evident that the reverse configuration can be made as well: said first region of said first conductivity type being connected to ground and said substrate of said second conductivity type being connected to a pad contact. A pad contact is the bonding pad connection of the device to the external devices or structures. Preferably, it is an Input/Output pad, or the connection to the package of the device, or the connection to the programming pin for fuses, or the connection to the supply voltage.

In an embodiment of the invention, the device of the invention can be integrated within said substrate with an integrated circuit having a functionality and that needs to be protected against overvoltage levels or electrostatic discharge pulses. The connection to such integrated circuit can also be done via the bonding pad.

In a third aspect of the invention, a protection circuit for electrostatic discharge or overvoltage protection applications is disclosed, said circuit comprising at least two, preferably MOS, transistors in series, said transistors having at least two electrodes and one control terminal, one electrode of the first transistor being connected to one electrode of the second transistor, the other electrode of said transistors being connected to the respective control terminals of said transistors. Said transistors preferably are of the opposite type and one control terminal of one transistor can be grounded while the control terminal of the second transistor is connected to a pad contact.

In another embodiment of this third aspect of the invention, one electrode of the first transistor is directly connected to the one electrode of the second transistor. An additional junction of first and second conductivity type regions can be present inbetween the one electrode of the first transistor and the one electrode of the second transistor.

Yet, all combinations of the different embodiments according to different aspects of the invention are feasible.

DETAILED DESCRIPTION OF THE INVENTION

Figure 10:
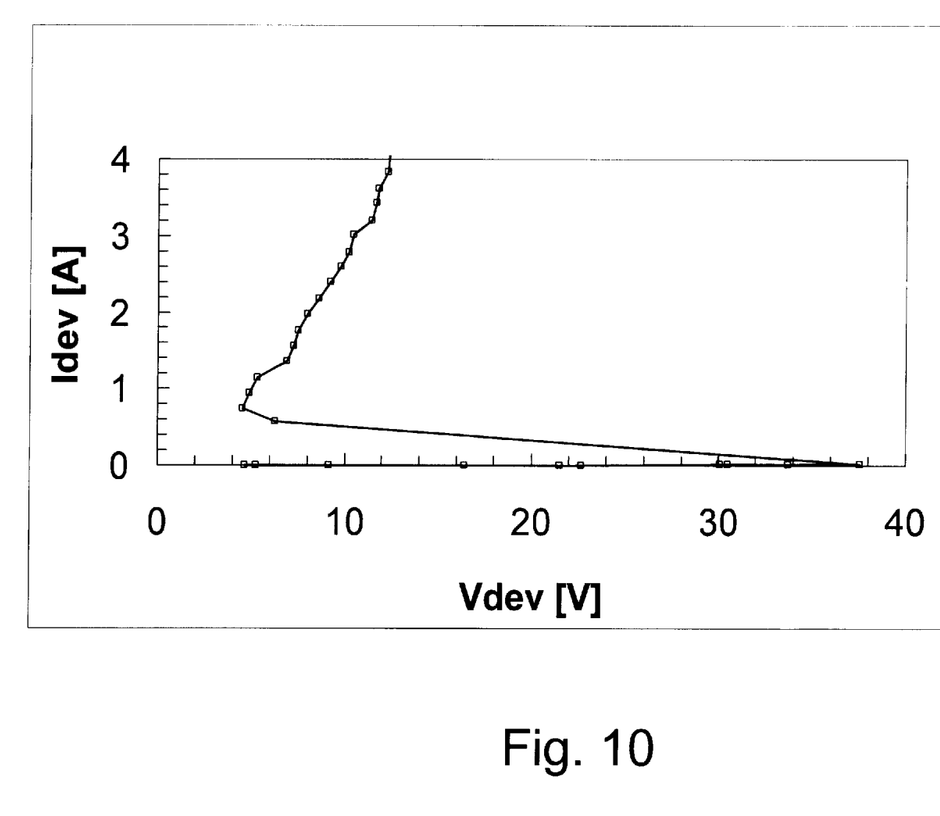
FIG. 10 shows a characteristic of the device of the invention as shown in FIG. 8; the characteristic is measured with a TLP measurement set-up.

For the purpose of teaching of the invention, several embodiments of the invention are disclosed in the sequel. In a best mode of the invention, the devices of the invention are fabricated in a 0.7 μm CMOS technology, the I2T technology offered by ALCATEL MICROELECTRONICS. The measurement characteristics shown in FIG. 7 and in FIG. 10 are taken on such devices. The design rules of this technology are known and the fabrication of the devices of the invention can be made making use of standard process steps being offered with this technology. It is evident that a person of skill in the art will be able to imagine other embodiments of the invention, the spirit and scope of the invention being limited only by the terms of the appended claims.

Figure 5A:
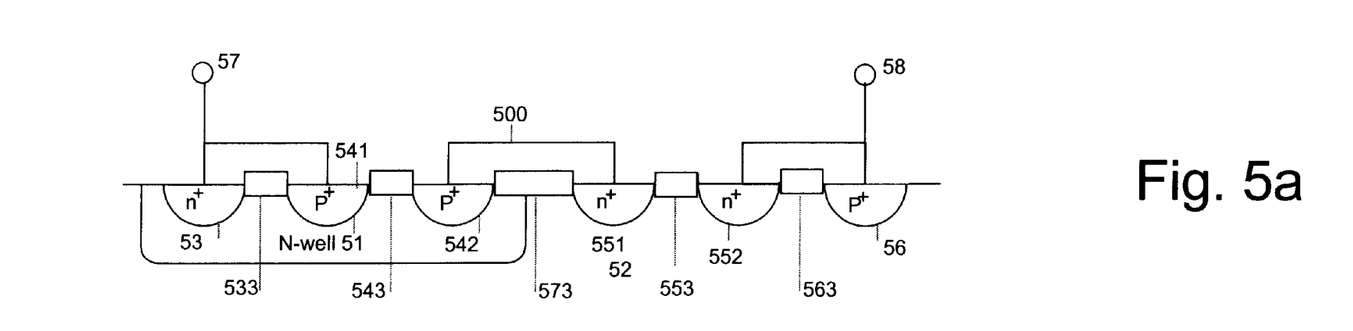
FIGS. 5a and 5b show the cross sections of embodiments of device of one aspect of the invention.
Figure 5B:
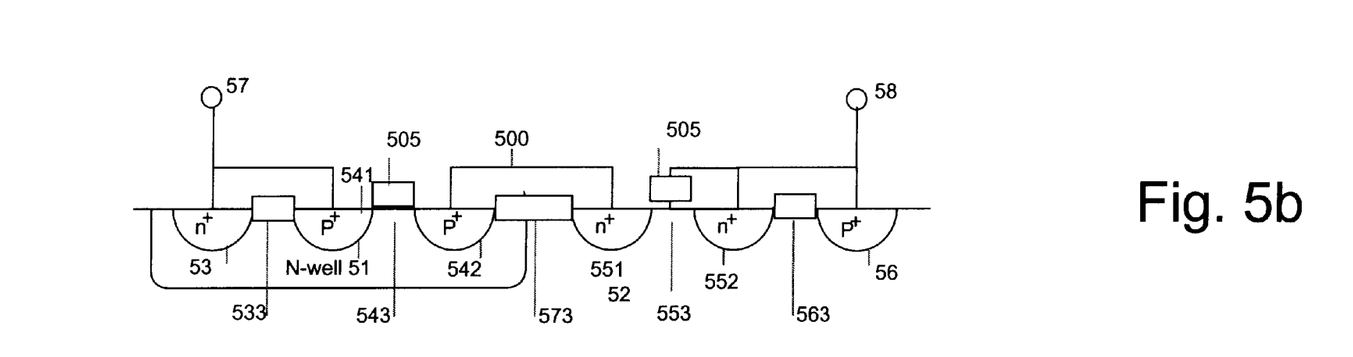
Figure 6:
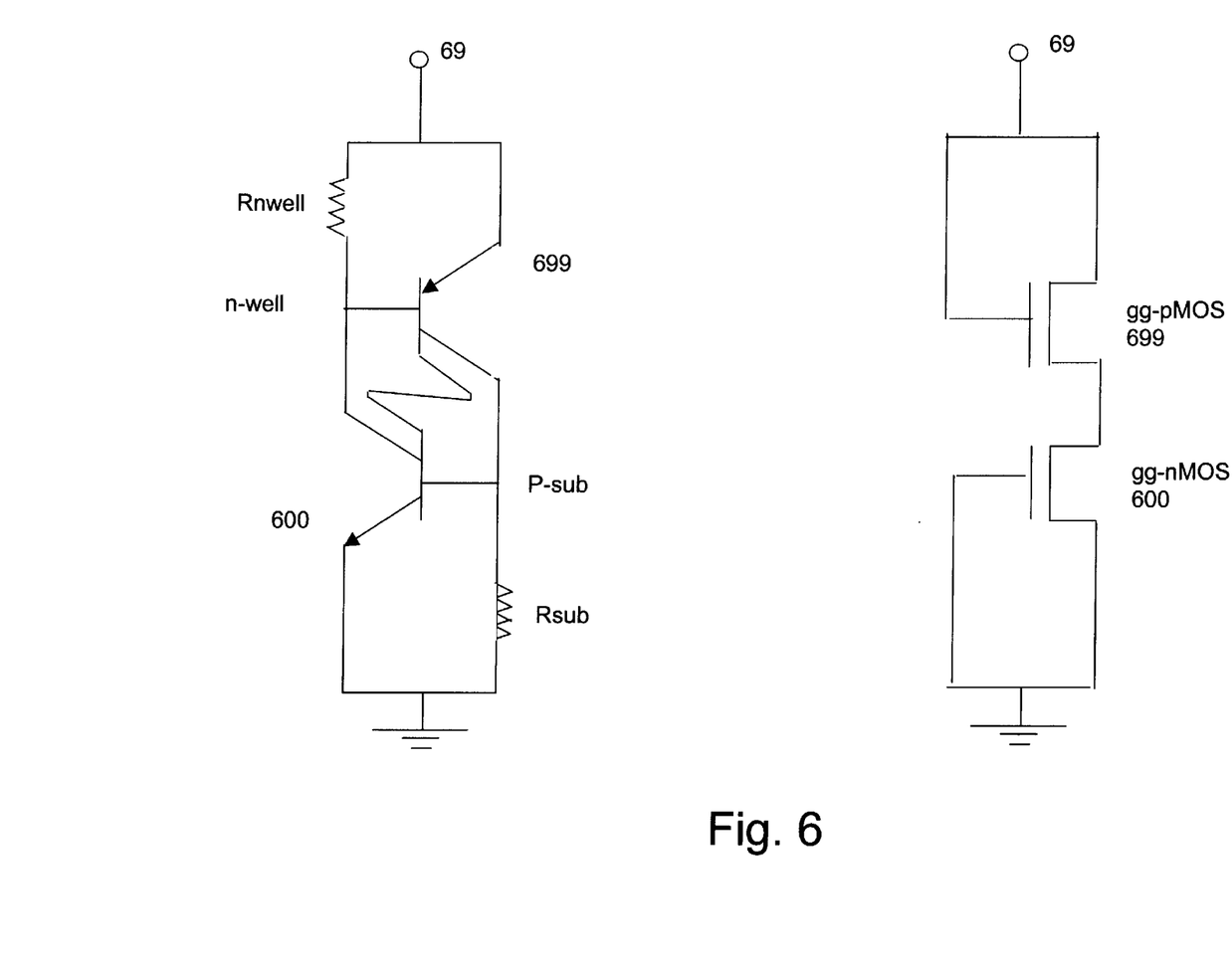
FIG. 6 shows the equivalent circuit representation of the SCR-devices shown in FIGS. 5a and 5b.

Cross sections of two embodiments of the devices of the invention are shown on FIG. 5, whereas two circuit equivalents are given in FIG. 6.

The semiconductor device of FIG. 5 is a device for electrostatic discharge or overvoltage protection applications. The device comprises a first region 51 of a first conductivity type in a semiconducting substrate 52 of a second conductivity type and at least two separated regions 541 542 of said second conductivity type being within said first region 51, said separated regions of said second conductivity type not abutting the substrate region of said second conductivity type. The device further comprises at least two separated regions of said first conductivity type 551 552) being within said substrate, said separated regions of said first conductivity type not abutting said first region; and a connection 500 inbetween at least one of said separated regions of said second conductivity type within said first region and at least one of said separated regions of said first conductivity type within said substrate.

The connection is such that said device can absorb an electrostatic discharge pulse or an overvoltage level at an intermediate voltage level. Said connection according to the embodiment shown in FIG. 5a is a low-resistive connection, preferably a metal line 500, and preferably external to said first region and to said substrate.

One aspect of the invention, the regions of at least one of the set of said separated regions can be separated by an insulating material, said material preferably comprising an oxide material 543 553 (FIG. 5a). The separated regions can also be separated by a control terminal 505 overlying said substrate or said first region with an insulating material 504 therebetween (FIG. 5b). Thus, a transistor configuration is formed among the sets of separated regions. One region of one or both sets of said separated regions can be directly connected to the control terminal of each set respectively.

In the device of the invention shown in FIG. 5, said first region of said first conductivity type is connected to a pad contact 57 and said semiconducting substrate of said second conductivity type is connected to ground 58, the connections to said pad contact and to ground 58 preferably being via a highly doped contact region in said first region and said substrate respectively 53 56. There are oxide regions 533 543 563 573 inbetween the highly doped contact 53 56 regions and the separated regions 541 552 and inbetween the different separated regions 551 542 referred to above.

In the device of the invention according to the embodiment shown in FIG. 5, two $p^+$ regions 541 542 are implanted in a n-well 51, whereas two $n^+$ regions 551 552 are implanted in the p-substrate 52. The implanted regions are separated and can have a spacing. This spacing is a design rule of the device and this spacing is of influence on the trigger voltage and snapback of the device. One region of each set of separated regions is connected to a region of the other set of separated regions 542–551, by a metal connection 500. The 2 $p^+$-regions 541 542 in the n-well as well as the 2 $n^+$-regions 551 552 in the substrate can be spaced apart by either a field oxide (LOCOS) or a poly-silicon gate (a transistor structure). The former case is shown in FIG. 5a, whereas the latter case is shown in FIG. 5b.

In the first equivalent circuit shown on FIG. 6, the structure is represented as a SCR merged transistor pair, with however a second collector for both the pnp and npn transistors. Both second collectors are connected to each other. In a second equivalent circuit scheme, the structure can be represented as being a series circuitry of a p-MOS and an n-MOS transistor, with the source and the gate of the p-MOS connected to the pad, and the source and the gate of the n-MOS connected to the ground, whereas the drains of both nMOS and pMOS are connected to each other.

The operation of the new device is as follows. When a positive ESD pulse is applied to the pad, the structure is initially off, as both p-MOS and n-MOS transistors 600 699 as well as both parasitic bipolar transistors are off. The device will go into breakdown when either the n-well to substrate junction breaks down, which happens at 40–50V, or when both the second $p^+$/n-well diode 542/51 and the second n+/p-substrate diode 551/52, which are connected in series, are going into breakdown, i.e. when the drain of both the nMOS and the pMOS transistor are going into breakdown. The latter happens typically at a voltage equal to the sum of both breakdown voltages:

$$V_{BD}=V_{BDn+p}+V_{Dn+p}$$

which is typically 26–28V, and therefore the n-well/p-substrate will not trigger first. The electron/hole pairs generated in both the drains of the nMOS and pMOS transistors will flow to the n+-well and p-substrate contacts, respectively, and will eventually trigger the nMOS and/or pMOS transistor into snapback. This then triggers the complete SCR into the low holding voltage state. This means that this SCR-structure has a trigger voltage of 26–28V, but still shows a low holding voltage of the device.

Figure 7:
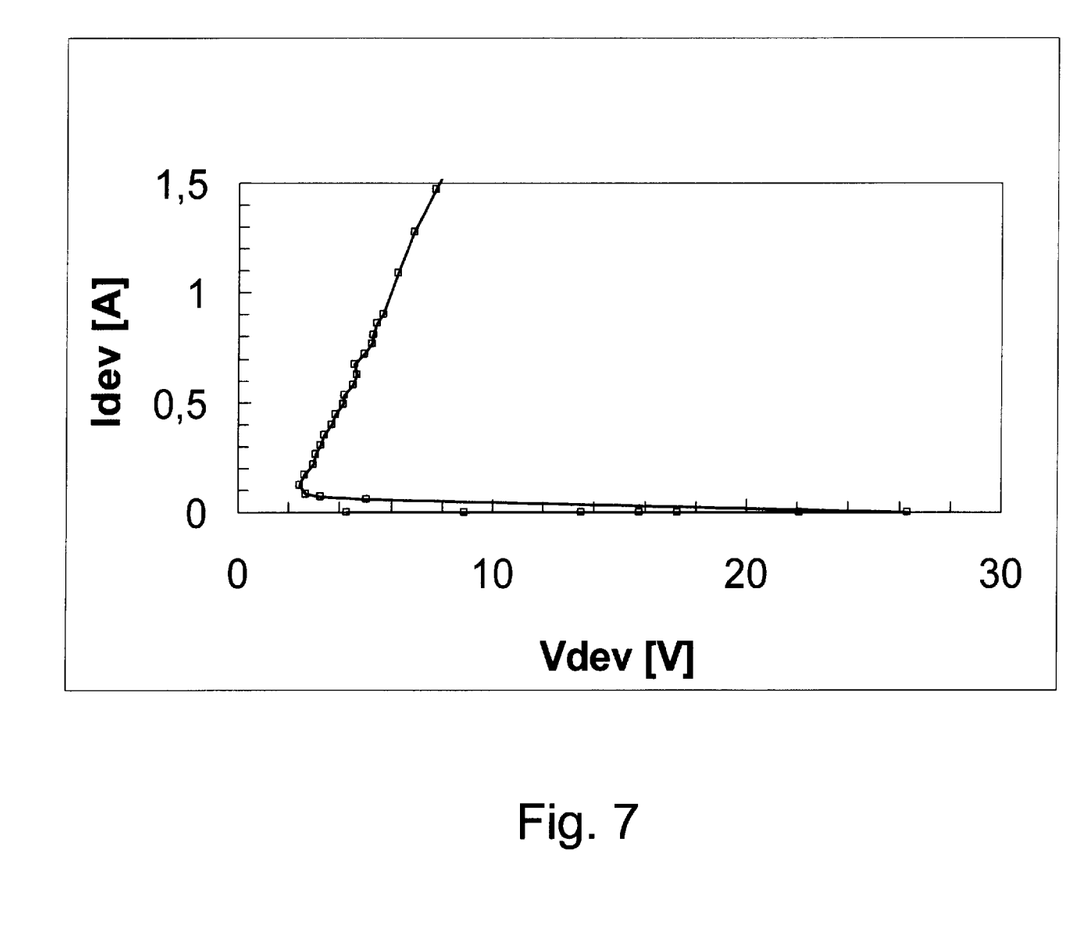
FIG. 7 shows a characteristic of the device of the invention as shown in FIG. 5; the characteristic is measured with a TLP measurement set-up.

Measurement characteristics on devices according to the embodiment shown in FIGS. 5/6 are shown in FIG. 7. The measurement characteristic is taken with a Transmission Line Pulse (TLP) set-up which is a measurement technique that is known in the art. The TLP set-up creates a voltage/current pulse over the device of the invention and the response is recorded. It is seen from the characteristic in FIG. 7 that the device of the invention has a trigger voltage ($V_{snap}$) of about 26 Volt at which stage the device goes into snapback and the device can withstand a current of higher than 1.5 A at the low holding voltages shown in the figure.

Figure 8:
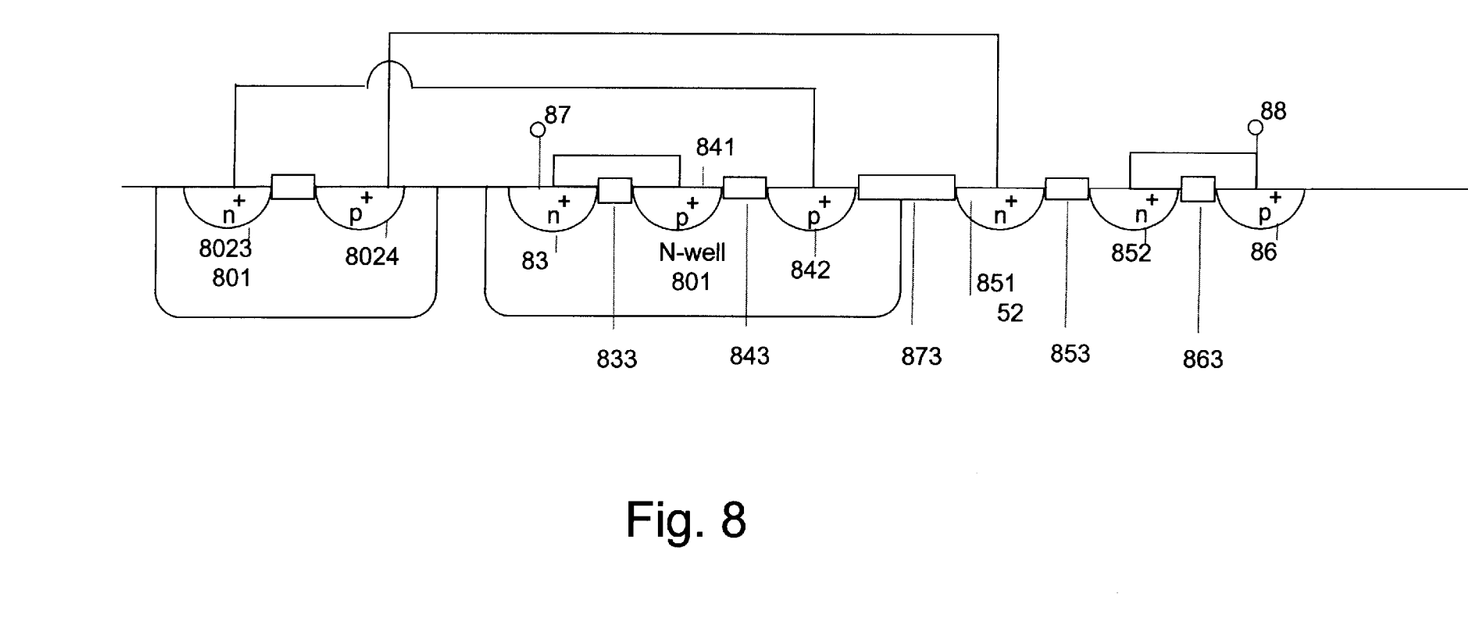
FIG. 8 shows the cross section of another embodiment of the device of the invention.
Figure 9:
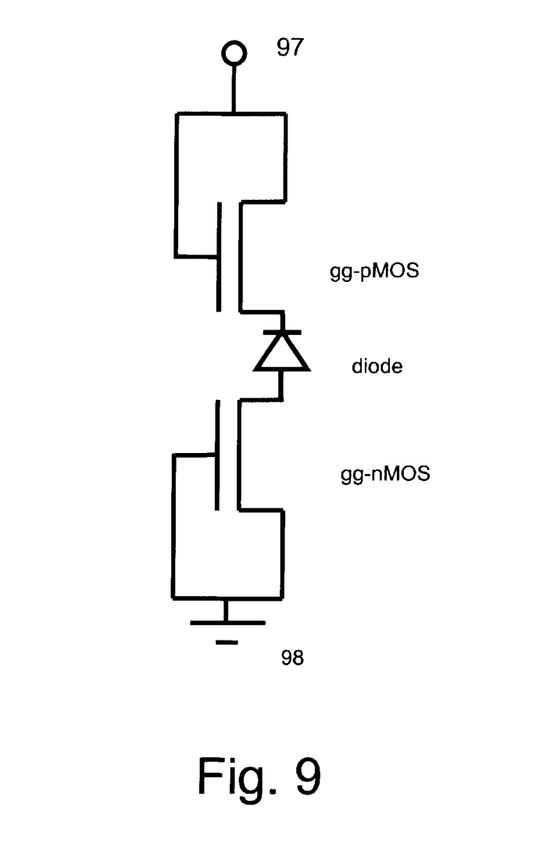
FIG. 9 shows the equivalent circuit representation of the SCR-device shown in FIG. 8.

In another embodiment of the device, an additional diode 901, as shown in FIG. 9, a component with a breakdown voltage, or more diodes can be inserted between the two drains of the nMOS and pMOS (i.e. between the two extra collectors of the parasitic npn and pnp transistors). This embodiment of the invention is shown in FIG. 8. A second n-well 802 is made in the p-type substrate in addition to the first n-well region 801. A n+ region and a p+ region are implanted in the second n-well. The n+ region is serving as contact region. The p+ region 8024 is forming a diode with the n-well. This diode can thus be constructed as a p+/n-well diode, where the p+ region is connected to the drain of the nMOS 851, and the n-well is connected to the drain of the pMOS 842. A schematic of this variation is shown on FIG. 9. This structure operates in substantially the same way as the previous embodiment shown in FIG. 5, except that it will trigger at a voltage equal to $$V_{BD}=V_{BDn+p}+2\ V_{BDp+n}$$

which is typically 38–42V.

Measurement characteristics on devices according to the embodiment shown in FIGS. 8 and 9 are shown in FIG. 10. The measurement characteristic is taken with a Transmission Line Pulse (TLP) set-up which is a measurement technique that is known in the art. The TLP set-up creates a voltage/current pulse over the device of the invention and the response is recorded. It is seen from the characteristic in FIG. 10 that the device of the invention has a trigger voltage ($V_{snap}$) of about 38 Volt at which stage the device goes into snapback and the device can withstand a current of higher than 4 A at the low holding voltages shown in the figure.

It is shown with the present embodiments that the trigger voltage gap between 13–14V and 50V can be filled with new SCR structures that are triggering at intermediate voltages of 26–28V and 38–42V. Thus, these embodiments show a device for electrostatic discharge or overvoltage protection applications. A semiconductor device for electrostatic discharge or overvoltage protection applications is disclosed, said device comprising means for absorbing an electrostatic discharge pulse or an overvoltage level, said means being triggered at intermediate voltages and said means being in a series configuration of at least two trigger components 542/51, 842/81 and 551/52, 851/82. Said means can further be extended with a third trigger component 901 and possibly further trigger components in said series configuration, the addition of said third and further trigger components extending sequentially the range of the intermediate trigger voltages.

Figure 11:
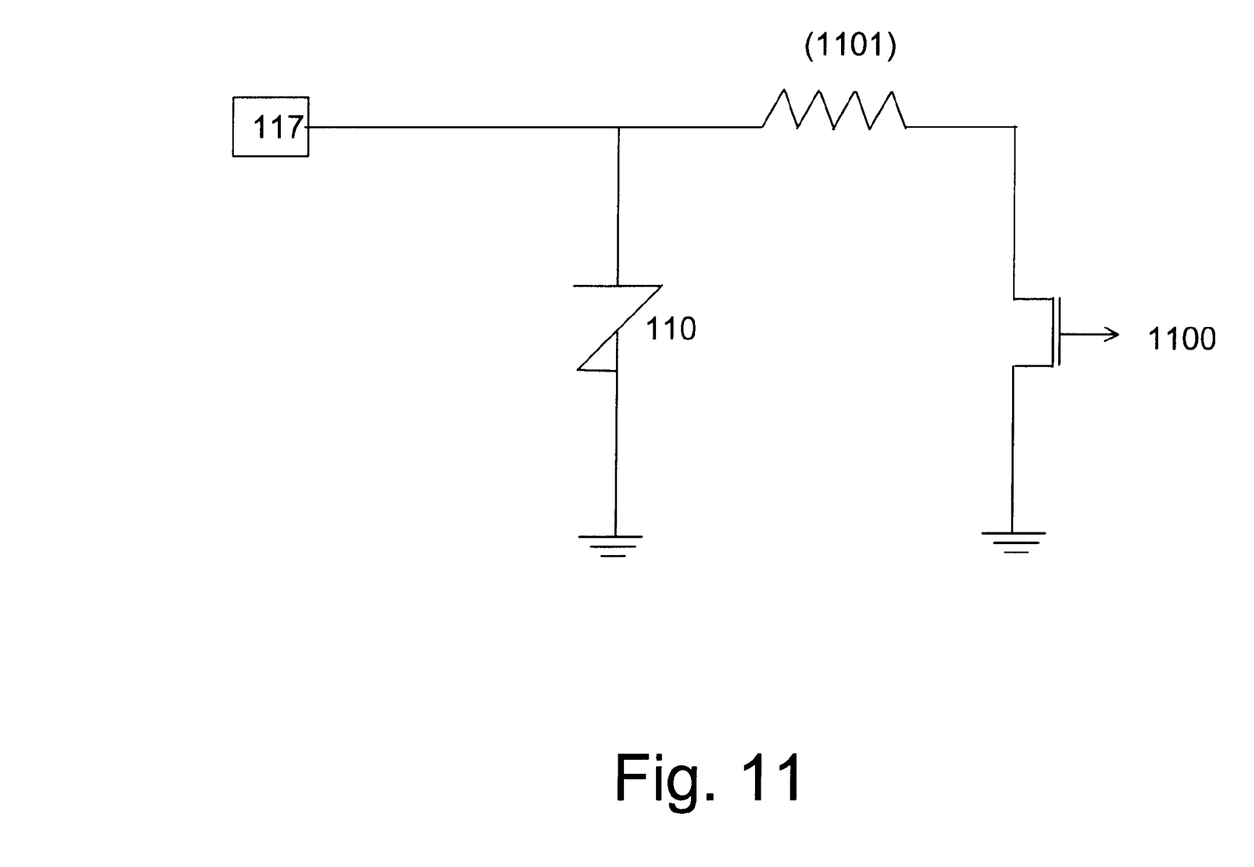
FIG. 11 shows the schematic representation of yet another embodiment of the invention.

Yet in another embodiment of the invention, the schematic of which is shown in FIG. 11, the device can further comprise an integrated circuit having a functionality and an impedance 1101 being in the connection of said means 110 to said circuit 1100. Said means and said circuit can be in a parallel configuration. The impedance can be replaced by any means being adapted for building up a voltage drop. The impedance preferably is a resistor as shown in FIG. 11. Typically the resistor has a value of about 100–500 Ω. Said circuit further comprises components or has components in parallel or connected to the circuit, components that convert an overvoltage level or an electrostatic discharge pulse of an intermediate level into an electrical current. These components can be two diodes in a series configuration that as a consequence thereof break down at an intermediate voltage level thereby creating said current in said resistor. Said current creates a voltage of an intermediate level over said impedance, said voltage triggering said means 110 such that said overvoltage level or electrostatic discharge pulse is absorbed in said means. The series configuration of the two diodes that go into breakdown is not adapted for absorbing the overvoltage level or electrostatic discharge pulse and therefore the means 110 of the device of the invention is needed. This embodiment of the device of the present invention is especially advantageous for taking up an overvoltage level or electrostatic discharge pulse during the first nanoseconds, about 1–3 ns, after the pulse or overvoltage level is applied to the circuit.

It is to be understood that additional alternative forms of the various components of the described embodiments are covered by the full scope of equivalents of the claimed invention. Those skilled in the art will recognize that the preferred embodiment described in the specification may be altered and modified without departing from the true spirit and scope of the invention as defined in the following claims, which particularly point out and distinctly claim the subjects regarded as the invention.

What is claimed is:

1. A semiconductor device for electrostatic discharge or overvoltage protection, said device comprising:
    a first region of a first conductivity type in a semiconducting substrate of a second conductivity type, at least a first and a second separated region of said second conductivity type being within said first region, said separated regions of said second conductivity type not abutting the substrate region of said second conductivity type;
    at least a first and a second separated region of said first conductivity type being within said substrate, said separated regions of said first conductivity type not abutting said first region; and
    a connection, said connection only being connected to said first separated region of said second conductivity type within said first region and to said first separated region of said first conductivity type within said substrate, said connection not being connected to an external voltage source,
    wherein one of said second separated regions is connected to an input and the other of said second separated regions is connected to a fixed voltage.

2. The device as recited in claim 1 wherein said connection is such that said device is adapted for absorbing an electrostatic discharge pulse or an overvoltage level of an intermediate voltage level.

3. The device as recited in claim 1 wherein said connection is a low-resistive connection.

4. The device as recited in claim 3 wherein said connection is a metal line.

5. The device as recited in claim 3 wherein said connection is external to said first region and to said substrate.

6. The device as recited in claim 1 wherein said connection comprises at least one component having a breakdown voltage, said component being in series with said separated regions of said second conductivity type and said separated regions of said first conductivity type.

7. The device as recited in claim 1 wherein said connection comprises at least one region of one (first or second) conductivity type, said region being within a second region of the other (second or first) of said conductivity types, said one region of said one conductivity being directly connected with a low-resistive connection to one of the separated regions of the other conductivity type.

8. The device as recited in claim 7 wherein said first and said second conductivity types are opposite conductivity types.

9. The device as recited in claim 1 wherein the regions of at least one of the set of said separated regions are separated by an insulating material.

10. The device as recited in claim 9 wherein said insulating material includes an oxide material.

11. The device as recited in claim 1 wherein the regions of at least one of the set of said separated regions are separated by a control terminal overlying said substrate or said first region with an insulating material therebetween.

12. The device as recited in claim 11 wherein one region of at least one of the set of said separated regions is directly connected to the control terminal of said one set.

13. The device as recited in claim 1 wherein said first region of said first conductivity type is connected to a pad contact and wherein said semiconducting substrate of said second conductivity type is connected to ground.

14. The device as recited in claim 13 wherein the connections to said pad contact and to ground include a highly doped contact region in said first region and said substrate respectively.

15. The device as recited in claim 1 wherein the sets of separated regions are within the surface layer of respectively said first region and said substrate and wherein said device is made in a CMOS technology.

16. The device as recited in claim 15 being integrated within said substrate with an integrated circuit having a functionality.

17. A semiconductor device for electrostatic discharge or overvoltage protection applications, said device comprising means for absorbing an electrostatic discharge pulse or an overvoltage level, said means being triggered at intermediate voltages and said means including a series configuration of at least two trigger components,
wherein the trigger components include at least two connections, the first connection of the first trigger component being connected to an input, the second connection of the first component being connected to the first connection of the second trigger component and not to an external voltage, the second connection of the second trigger component being connected to a fixed voltage, and
wherein the first trigger component is in a region of a first conductivity type and the second trigger component is in a region of a second conductivity type, the first conductivity type being different from the second conductivity type.

18. The semiconductor device as recited in claim 17 wherein said means further includes a third trigger component.

19. The semiconductor device as recited in claim 18 further comprising additional trigger components, the third trigger component and additional trigger components in the series configuration, the third and additional trigger components extending sequentially the range of the intermediate trigger voltages.

20. The semiconductor device as recited in claim 19 wherein said the trigger component components each have a specific breakdown voltage, the sum of the breakdown voltages defining the specific intermediate trigger voltage of said device.

21. The semiconductor device as recited in claim 20 wherein the trigger components are diodes.

22. The semiconductor device as recited in claim 17 further comprising an integrated circuit having a functionality and an impedance being in the connection of said means to said circuit, said circuit comprising components that convert an overvoltage level or an electrostatic discharge pulse of an intermediate level into an electrical current, said current creating a voltage over said impedance, said voltage triggering said means.

23. A protection circuit for electrostatic discharge or overvoltage protection applications, said circuit comprising at least two transistors in series, said transistors having at least two electrodes and one control terminal, one electrode of the first transistor being connected to one electrode of the second transistor and not being connected to an external voltage source, the other electrode of said transistors being connected to the respective control terminals of said transistors, one of the control terminals being connected to an input and the other control terminal being connected to a fixed voltage.

24. The protection circuit as recited in claim 23 wherein said transistors are of opposite conductivity type.

25. The protection circuit as recited in claim 23 wherein the control terminal of one terminal is grounded and wherein the control terminal of the second transistor is connected to a pad contact.

26. The protection circuit as recited in claim 23 wherein the one electrode of the first transistor is directly connected to the one electrode of the second transistor.

27. The protection circuit as recited in claim 23 wherein an additional junction of first and second conductivity type regions is present inbetween the one electrode of the first transistor and the one electrode of the second transistor.

28. The device as recited in claim 1,
wherein the connection connects said second separated region of said second conductivity type with said first separated region of said first conductivity type, and
wherein said first separated region of said second conductivity type is connected to a pad contact.

29. The device as recited in claim 1,
wherein the connection connects said second separated region of said second conductivity type with said first separated region of said first conductivity type, and
wherein said second separated region of said first conductivity type is connected to ground.

30. The device as recited in claim 1,
wherein the one of said second separated regions comprises said second separated region of said second conductivity type, wherein the other of said second separated regions comprises said second separated region of said first conductivity type, and wherein said fixed voltage is ground or a negative voltage. 31. The device as recited in claim 30, wherein said first conductivity type is n type, and wherein said second conductivity type is p type.

32. The device as recited in claim 1, wherein the one of said second separated regions comprises said second separated region of said first conductivity type, wherein the other of said second separated regions comprises said second separated region of said second conductivity type, and wherein said fixed voltage is a supply voltage or a positive voltage.

33. The device as recited in claim 32, wherein said first conductivity type is n type, and wherein said second conductivity type is p type.

34. The device as recited in claim 17, wherein said first conductivity type is n type, and wherein said second conductivity type is p type.

35. The device as recited in claim 17, wherein at least one of said trigger components is in a well.

36. The device as recited in claim 17, wherein at least one of said trigger components is a transistor.

37. The device as recited in claim 17, wherein at least one of said trigger components is a diode.

38. A semiconductor device for electrostatic discharge or overvoltage protection applications, said device comprising a series configuration of at least two trigger components, wherein the at least two trigger components absorb an electrostatic discharge pulse or an overvoltage level and are triggered at intermediate voltages, wherein the trigger components include at least two connections, the first connection of the first trigger component being connected to an input, the second connection of the first component being connected to the first connection of the second trigger component and not to an external voltage, the second connection of the second trigger component being connected to a fixed voltage, and wherein the first trigger component is in a region of a first conductivity type and the second trigger component is in a region of a second conductivity type, the first conductivity type being different from the second conductivity type.

39. The device as recited in claim 38, wherein said first conductivity type is n type, and wherein said second conductivity type is p type.

* * * * *

UNITED STATES PATENT AND TRADEMARK OFFICE
CERTIFICATE OF CORRECTION

PATENT NO. : 6,570,226 B1
DATED : May 27, 2003
INVENTOR(S) : Groeseneken et al.

It is certified that error appears in the above-identified patent and that said Letters Patent is hereby corrected as shown below:

<u>Title page,</u>
Item [73], Assignee, please correct the spelling of the (first) Assignee to:
-- Interuniversitair Microelektronica Centrum (IMEC), Leuven (BE)

Signed and Sealed this

Thirtieth Day of September, 2003

JAMES E. ROGAN
*Director of the United States Patent and Trademark Office*